(12) United States Patent
Henderson et al.

(10) Patent No.: US 10,187,037 B2
(45) Date of Patent: Jan. 22, 2019

(54) STICK-SLIP STAGE DEVICE AND METHODS OF USE THEREOF

(71) Applicant: New Scale Technologies, Inc., Victor, NY (US)

(72) Inventors: David A. Henderson, Farmington, NY (US); Qin Xu, West Henrietta, NY (US); Daniele Piazza, Pittsford, NY (US)

(73) Assignee: New Scale Technologies, Inc., Victor, NY (US)

( * ) Notice: Subject to any disclaimer, the term of this patent is extended or adjusted under 35 U.S.C. 154(b) by 328 days.

(21) Appl. No.: 15/239,510

(22) Filed: Aug. 17, 2016

(65) Prior Publication Data

US 2017/0054388 A1 Feb. 23, 2017

Related U.S. Application Data

(60) Provisional application No. 62/208,137, filed on Aug. 21, 2015.

(51) Int. Cl.
| | |
|---|---|
| *H01L 41/09* | (2006.01) |
| *H03H 9/17* | (2006.01) |
| *H03H 9/205* | (2006.01) |
| *H02N 2/02* | (2006.01) |
| *H02N 2/06* | (2006.01) |

(52) U.S. Cl.
CPC ............ *H03H 9/176* (2013.01); *H02N 2/025* (2013.01); *H03H 9/205* (2013.01); *H02N 2/062* (2013.01); *H02N 2/067* (2013.01)

(58) Field of Classification Search
CPC ......... H03H 9/176; H03H 9/205; H02N 2/025

USPC .............. 310/316.01–316.03, 317, 318, 311, 310/323.01–323.21, 328

See application file for complete search history.

(56) References Cited

U.S. PATENT DOCUMENTS

| | | | |
|---|---|---|---|
| 4,195,243 A | 3/1980 | Thaxter | |
| 5,225,941 A | 7/1993 | Saito et al. | |
| 5,587,846 A | 12/1996 | Miyano et al. | |
| 6,252,333 B1 * | 6/2001 | Iino | H01L 41/0913 310/323.17 |
| 8,059,346 B2 | 11/2011 | Henderson | |
| 2005/0259155 A1 * | 11/2005 | Okada | H02N 2/025 348/207.99 |

(Continued)

OTHER PUBLICATIONS

Yasuhiro Okamoto, et al., "Development of Linear Actuators Using Piezoelectric Elements", Electronics and Communications in Japan, Part 3, vol. 81, No. 11, 1998, pp. 11-17.

*Primary Examiner* — Thomas Dougherty
(74) *Attorney, Agent, or Firm* — LeClairRyan PLLC

(57) ABSTRACT

A stick-slip stage device includes a carriage assembly configured to support a payload, the carriage assembly comprising at least three piezoelectric stick-slip actuators each having one or more contact points. At least two rails are positioned on opposing sides of the carriage assembly and configured to interact with one or more of the contact points to form a guideway for movement of the carriage assembly. A fixed structure connects the at least two rails and is configured to generate a friction force between the at least two rails and one or more of the contact points of the at least three piezoelectric stick-slip actuators. A method of making a stick-slip stage device is also disclosed.

22 Claims, 14 Drawing Sheets

(56) References Cited

U.S. PATENT DOCUMENTS

| | | | |
|---|---|---|---|
| 2006/0170418 A1* | 8/2006 | Hata | G01D 5/145 324/207.24 |
| 2008/0074000 A1* | 3/2008 | Bennett | H02N 2/023 310/328 |
| 2008/0191583 A1* | 8/2008 | Bohn | H02N 2/025 310/329 |

* cited by examiner

US 10,187,037 B2

STICK-SLIP STAGE DEVICE AND METHODS OF USE THEREOF

This application claims the benefit of U.S. Provisional Patent Application Ser. No. 62/208,137, filed Aug. 21, 2015, which is hereby incorporated by reference in its entirety.

FIELD

This technology relates to a highly miniaturized positioning system that moves a payload and methods of use thereof More particularly, this technology relates to stick-slip stages with at least one dimension minimized to create a very thin shape.

BACKGROUND

Miniature positioning systems are useful for many applications including micro optics, imaging, medical devices, industrial instruments, and consumer electronics. Piezoelectric stick-slip actuators may be utilized to optimize size, power, and precision of the positioning system. An example of a stick-slip stage, operating at audible frequencies, is presented in U.S. Pat. No. 4,195,243 for a piezoelectric wafer mover, which is hereby incorporated by reference herein in its entirety. However, operation at ultrasonic frequencies, in which the operating noise is substantially inaudible, is highly desired for consumer products and medical devices. Examples of ultrasonic stick-slip actuators include: U.S. Pat. No. 5,225,941 for a driving device; U.S. Pat. No. 5,587,846 for a lens moving apparatus; and U.S. Pat. No. 8,059,346 for a linear drive system, each of which are hereby incorporated by reference herein in their entirety.

Commercial examples of ultrasonic stick-slip stages include the "smooth impact drive mechanism" (SIDM) sold by Konica Minolta (Japan) and the "tiny ultrasonic linear actuator" (TULA) sold by Piezoelectric Technologies (Korea). The SIDM is described in "Development of Linear Actuators Using Piezoelectric Element", Electronics and Communications in Japan, Part 3, Vol. 81, No. 11, 1998).

An ultrasonic stick-slip actuator generally includes a first body that is frictionally coupled to a second stationary body. One of the bodies must generate asymmetric pulses at the friction contact point, with unequal forward and reverse velocities and accelerations. For movement to occur, the slower direction of pulse velocity and acceleration is insufficient to overcome the friction between the two bodies while the faster direction of pulse velocity and acceleration is sufficient to overcome the friction between the two bodies, which creates a small relative movement between the two bodies during each asymmetric pulse cycle. These small movements may be less than one micrometer, but when added together create longer range movement. By switching the direction of the asymmetric pulse, the direction of motion is reversed. The asymmetric pulses can be created using piezoelectric or electrostrictive ceramic actuators that are energized by non-symmetric electrical drive signals. Piezoelectric actuators can be very small and still produce powerful and small amplitude asymmetric pulses that make it possible to produce highly miniaturized motion systems.

SUMMARY

A stick-slip stage device includes a carriage assembly configured to support a payload, the carriage assembly comprising at least three piezoelectric stick-slip actuators each having one or more contact points. At least two rails are positioned on opposing sides of the carriage assembly and configured to interact with one or more of the contact points to form a guideway for movement of the carriage assembly. A fixed structure connects the at least two rails and is configured to generate a friction force between the at least two rails and one or more of the contact points of the at least three piezoelectric stick-slip actuators.

A method of making a stick-slip stage device includes providing a carriage assembly configured to support a payload, the carriage assembly comprising at least three piezoelectric stick-slip actuators each having one or more contact points. At least two rails are positioned on opposing sides of the carriage assembly, the at least two rails configured to interact with one or more of the contact points to form a guideway for movement the carriage assembly. A fixed structure is provided connecting the at least two rails and is configured to generate a friction force between the at least two rails and one or more of the contact points of the at least three piezoelectric stick-slip.

The exemplary technology provides a number of advantages including providing a linear stage that utilizes at least three stick-slip actuators that work together to move a payload in a substantially linear direction, while advantageously requiring a total thickness of substantially less than 1 mm. Examples of this technology also provide a low-cost and easy to manufacture design for a linear stage that uses a single piezoelectric ceramic plate as the moving carriage. This plate may incorporate at least three active areas to operate the at least three stick-slip actuators where the actuators also kinematically support and guide the carriage. This configuration advantageously achieves a thin size, consumes minimum power, holds position without power, operates ultrasonically to minimize audible noise, uses asymmetric waveforms generated from a full-bridge digitally controlled switch, and operates from typical battery voltages without the need for voltage boost.

DETAILED DESCRIPTION

Figure 1A:
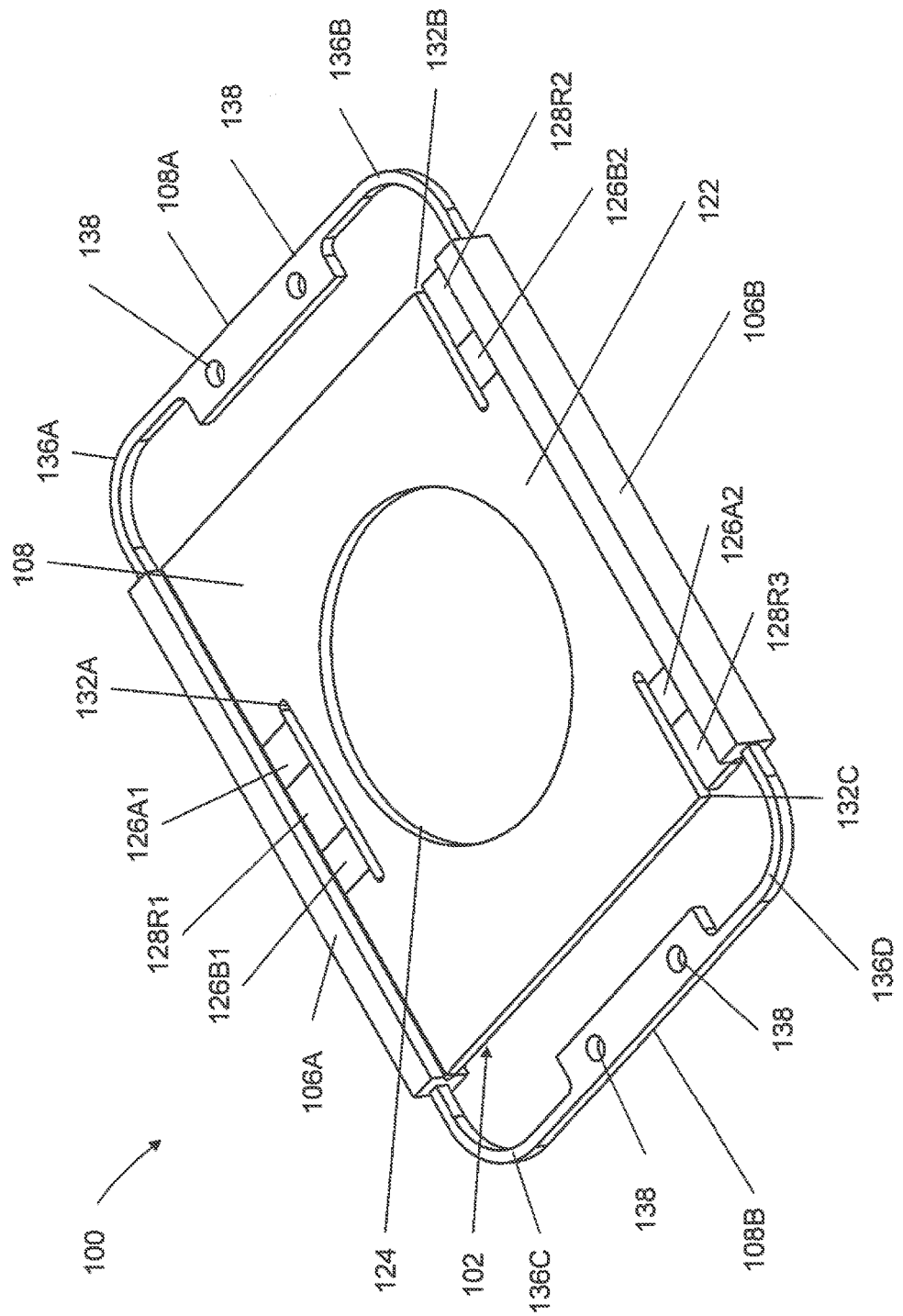
FIG. 1A is a perspective view of an example of a piezoelectric ultrasonic stick-slip stage.
Figure 1B:
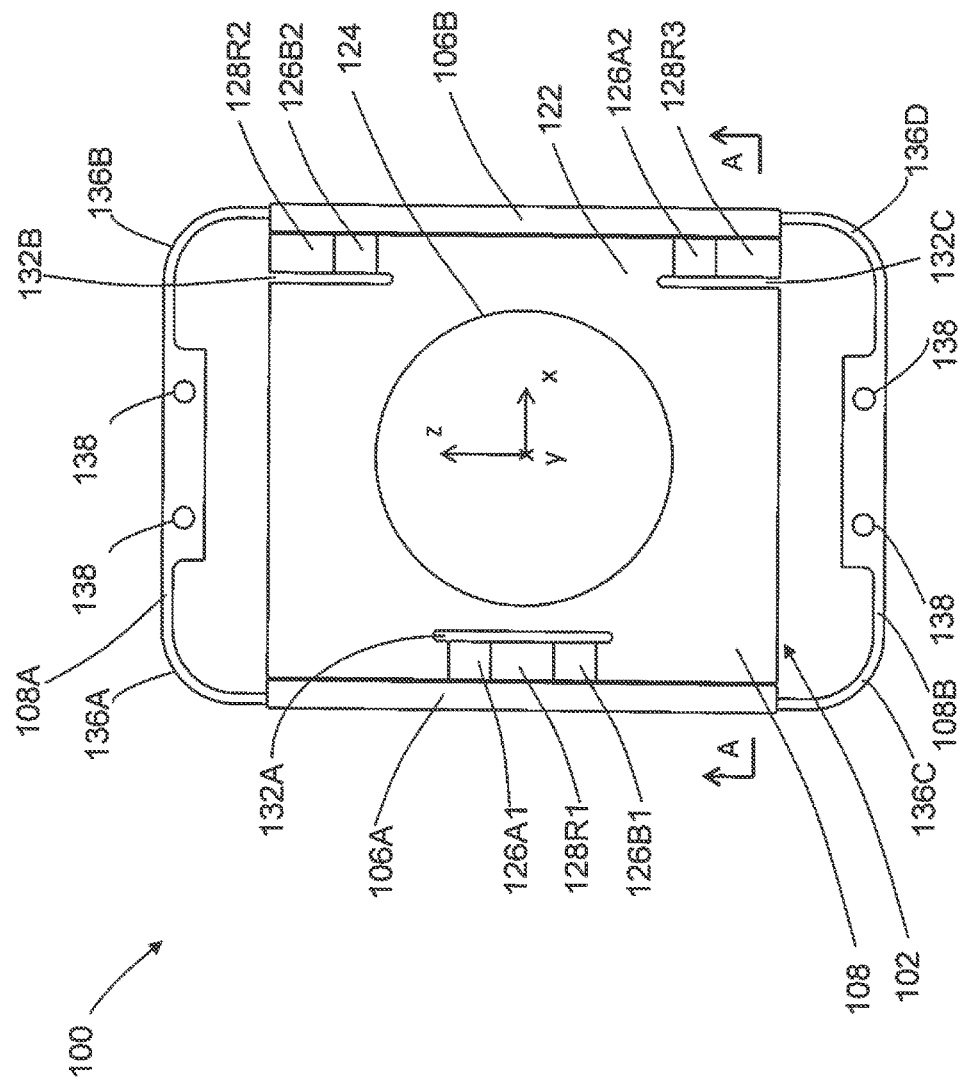
FIG. 1B is a top view (Y direction) of the piezoelectric ultrasonic stick-slip stage shown in FIG. 1A.
Figure 1C:
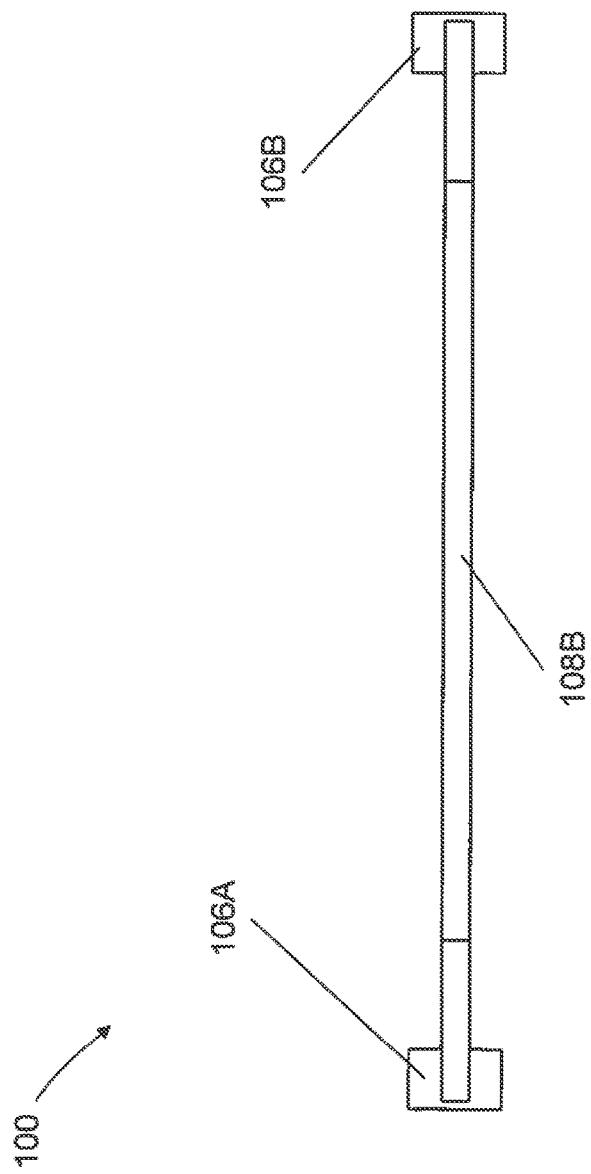
FIG. 1C is a front view (Z direction) of the piezoelectric ultrasonic stick-slip stage shown in FIG. 1A.
Figure 1D:
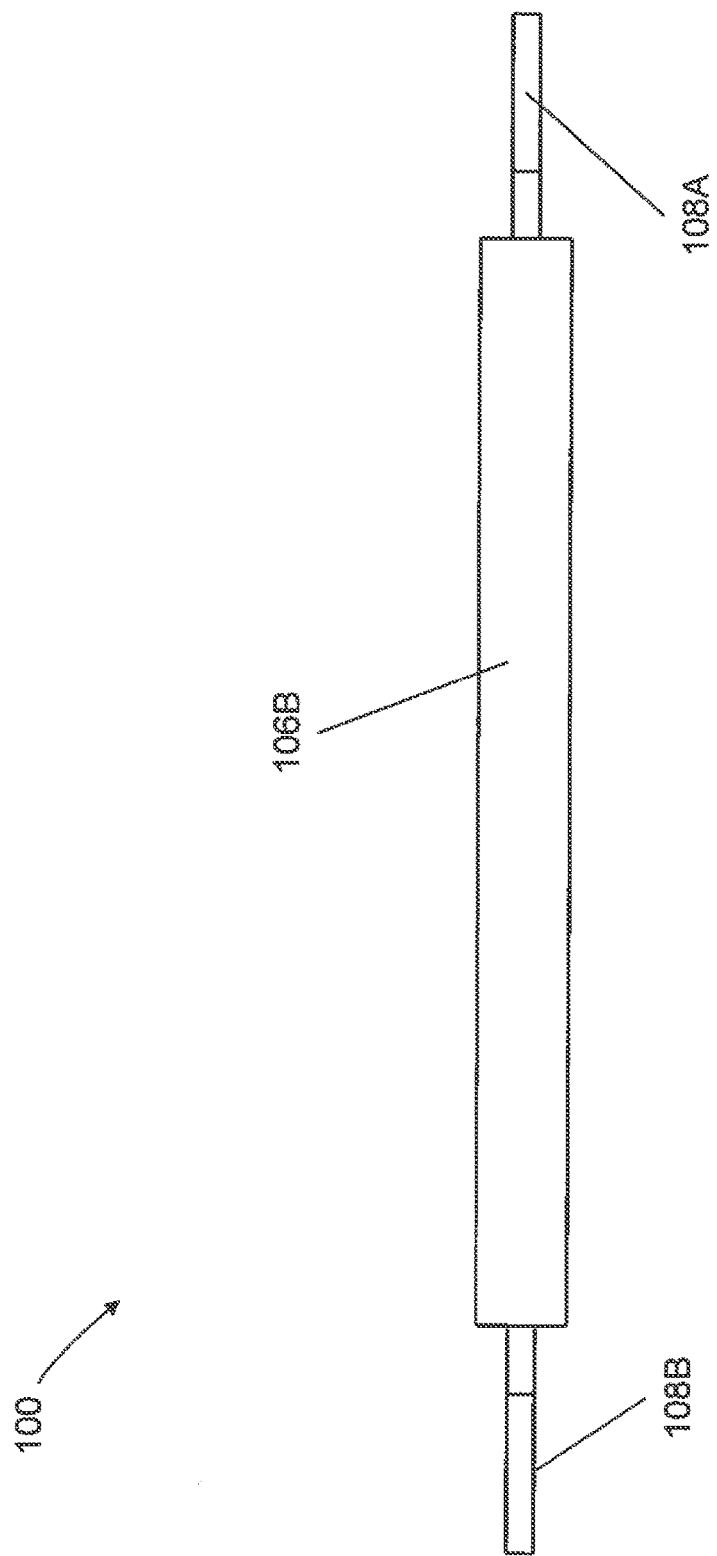
FIG. 1D is a side view (X direction) of the piezoelectric ultrasonic stick-slip stage shown in FIG. 1A.

An exemplary piezoelectric stick-slip stage device 100 that moves a payload to achieve a desired position is illustrated in FIGS. 1A-6. The exemplary piezoelectric stick-slip stage device 100 includes a payload or carriage assembly 102, stick-slip actuators 104(1), 104(2), and 104(3), a pair of rails 106A and 106B, brackets 108A and 108B, a position sensor 110, a drive circuit 112, a microcontroller 114, a power supply 116, and an external controller/processor 118, although the piezoelectric stick-slip stage device 100 could include other types and numbers of assemblies, devices, components, and/or other elements in other configurations. This exemplary technology provides a number of advantages including providing a more compact and efficient piezoelectric stick-slip stage device that moves a payload.

Referring now more specifically to FIGS. 4A-4D, the carriage assembly 102 includes a plate 120 having the stick slip actuators 104(1)-104(2) formed thereon. In this example, the plate 120 is made of a piezoelectric material, such as a single layer piezoelectric ceramic structure, although other piezoelectric materials may be utilized. The plate 120 may have a thickness of substantially less than 1 mm. In one example, the plate 120 has dimensions of 0.3 mm×10 mm×12 mm, although other dimensions may be utilized. The plate 120 is fabricated to create several functional regions including a main body 122 and the stick-slip actuators 104(1)-14(3). The main body 122 is configured to support the payload to be moved by the piezoelectric stick-slip stage device 100. By way of example, the main body 122 may be configured to support a lens or other optical components, although the main body 122 may support other types and/or numbers of payloads. In this example, the main body 122 includes a cutout region 124 located in the middle thereof that provides a clear aperture where a payload such as an optical device or other items can be placed, although the main body 122 may include other features in other locations for supporting other types and numbers of other payloads.

Figure 4A:
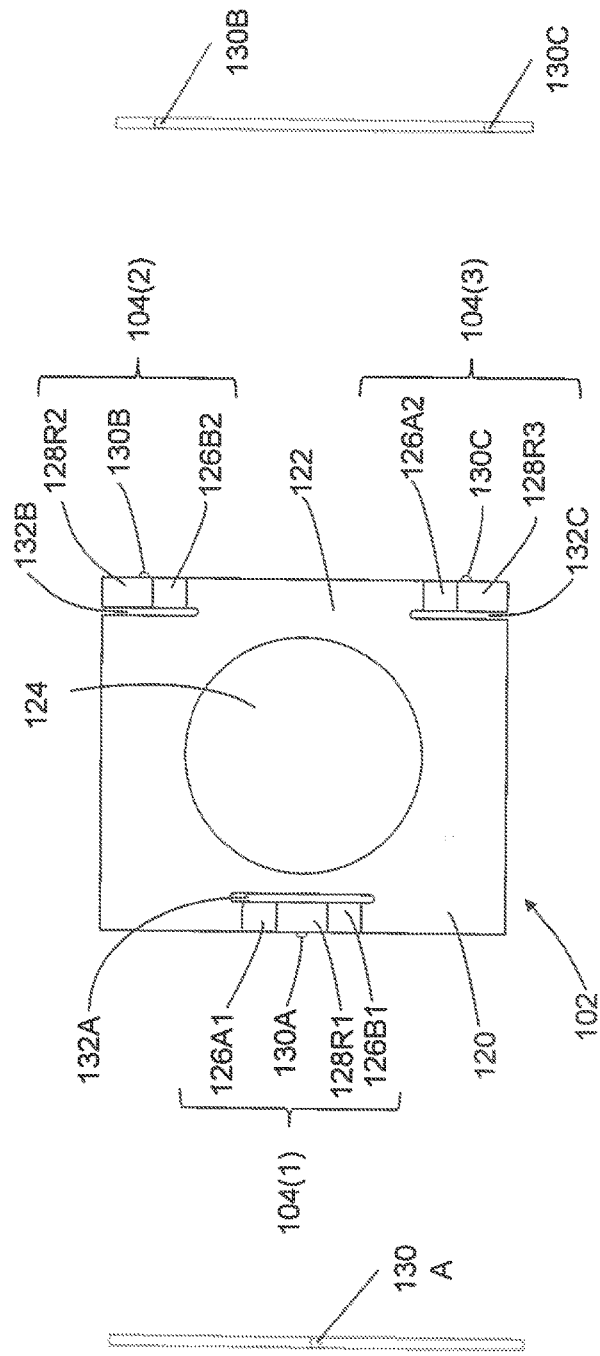
FIG. 4A is a top view (Y axis) of an exemplary carriage assembly for use with the piezoelectric ultrasonic stick-slip stage as shown in FIGS. 1A-1E.
Figure 4B:
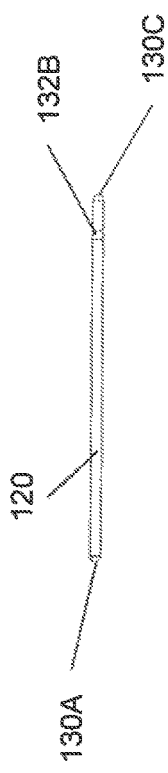
FIG. 4B is a front view (Z axis) of the carriage assembly shown in FIG. 4A.
Figure 4C:
FIG. 4C is a right-side (+X axis) view of the carriage assembly shown in FIG. 4A.
Figure 4D:
FIG. 4D is a left-side view (-X axis) view of the carriage assembly shown in FIG. 4A.

Referring now more specifically to FIG. 4A, the plate 120 includes the three stick slip actuators 104(1)-104(3) formed along the edges of the plate 120, although the plate 120 may have other numbers of stick slip actuators or other devices in other locations. In this example, the stick slip actuator 104(1) includes active areas 126A1 and 126B1 and a reaction mass 128R1; the stick-slip actuator 104(2) includes an active area 126B2 and a reaction mass 128R2; and the stick-slip actuator 104(3) includes an active area 126A2 and a reaction mass 128R3. Accordingly, the plate 120 includes active areas 126A1, 126B1, 126B2, and 126A2, while the main body 122 and the reaction masses 128R1, 128R2, and 128R3 provide non-active portions of the plate 120. The sum of the mass of stick-slip actuators 104(1)-104(3) is ideally less than 10% of the mass of the total carriage assembly 102.

Figure 5A:
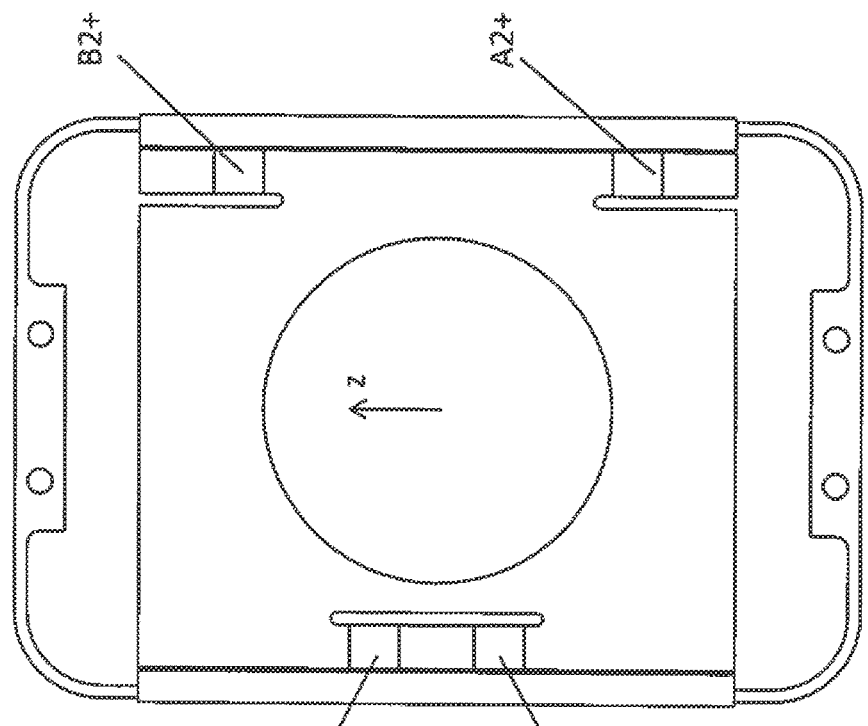
FIG. 5A shows the bottom view (-Y axis) of the external electrodes of the piezoelectric active regions in the example of the stick-slip stage as shown in FIGS. 1A-1E.
Figure 5B:
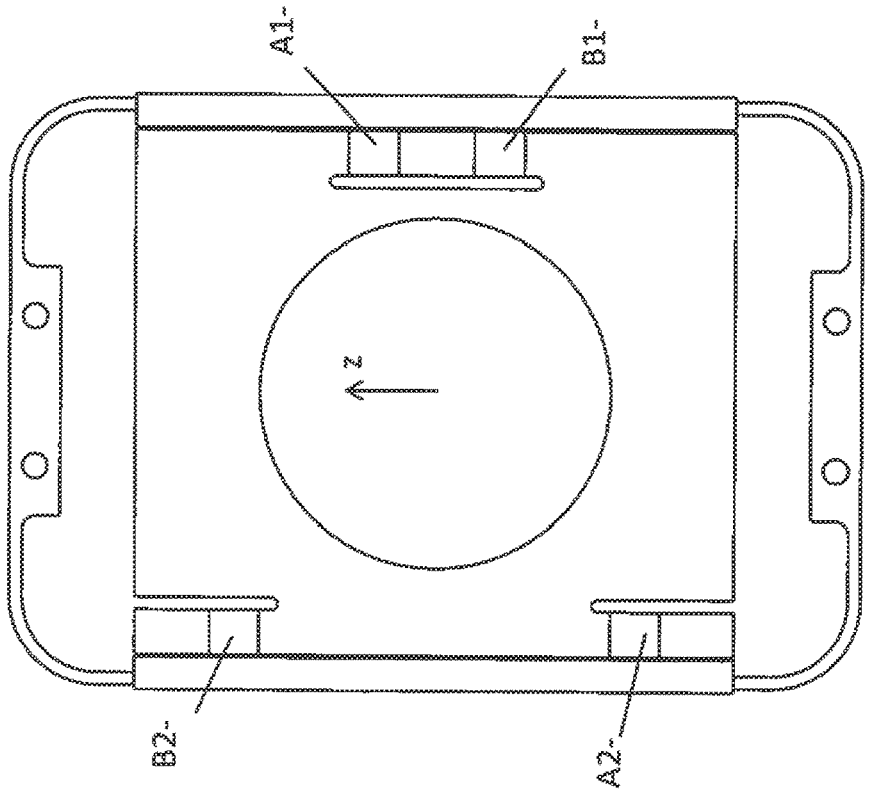
FIG. 5B shows the top view (+Y axis) of the external electrodes of the piezoelectric active regions in the example of the stick-slip stage as shown in FIGS. 1A-1E.

Referring now to FIGS. 5A and 5B, the plate 120 has electrodes A1+, A1-, A2+, A2-, B1+, B1-, B2+and B2- that are fabricated as part of the plate 120 and create the active areas 126A1, 126A2, 126B1, and 126B2. The plate 120 may be fabricated from co-fired multi-layer piezoelectric ceramic where the electrodes may be on the inside or outside of the plate and the electrical connection points may be at various locations on the surface of the plate based on manufacturing considerations.

In this example, the piezoelectric active area 126A1 has a positive electrode A1+ and a negative electrode A1-; the piezoelectric active area 130A2 has a positive electrode A2+ and A2-; the piezoelectric active area 130B1 has a positive electrode B1+ and a negative electrode B1-; and the piezoelectric active area 130B2 has a positive electrode B2+ and a negative electrode B2-, although the plate 120 may include other numbers of electrodes in other locations. In another example, the plate 120 could use internal or external conductive elements to combine the eight electrodes Al+, A1-, A2+, A2-, B1+, B1-, B2+and B2- so that a minimum of two electrical connection points are created on the outside of the plate 120, which simplifies the manufacturing process.

Referring again to FIGS. 4A-4D, the plate 120 also includes contact pads 130A, 130B, and 130C located on the sides of the plate 120 and associated with the stick-slip actuators 104(1), 104(2), and 104(3), respectively, although the plate 120 may have other types and numbers of contact surfaces in other locations. In this example, the contact pads 130A, 130B, and 130C are semi-spherical in shape, although other shapes may be utilized. The contact pads 130A, 130B, and 130C are made of ceramic materials, such as alumina or tungsten carbide, although other suitable materials may be utilized for the contact pads 130A, 130B, and 130C. In this example, the contact pad 130A is rigidly connected to the reaction mass 128R1 of the slip stick actuator 104(1), the contact pad 130B is rigidly connected to the reaction mass 128R2 of the slip stick actuator 104(2), and the contact pad 130C is rigidly connected to the reaction mass 128R3 of the slip stick actuator 104(3).

Referring now more specifically to FIG. 4A, the plate 122 slots 132A, 132B, and 132C formed into the main body 122. In this example, the slot 132A is located between the main body 122 and the stick slip actuator 104(1), the slot 132B is located between the main body 122 and the stick slip actuator 104(2), and the slot 132C is located between the main body 122 and the stick slip actuator 104(3). The slots 128A-128C are formed in the main body 122 to separate the motion of the stick-slip actuators 104(1)-104(3) from the main body 122 of the plate 120 as described in further detail below.

Figure 1E:
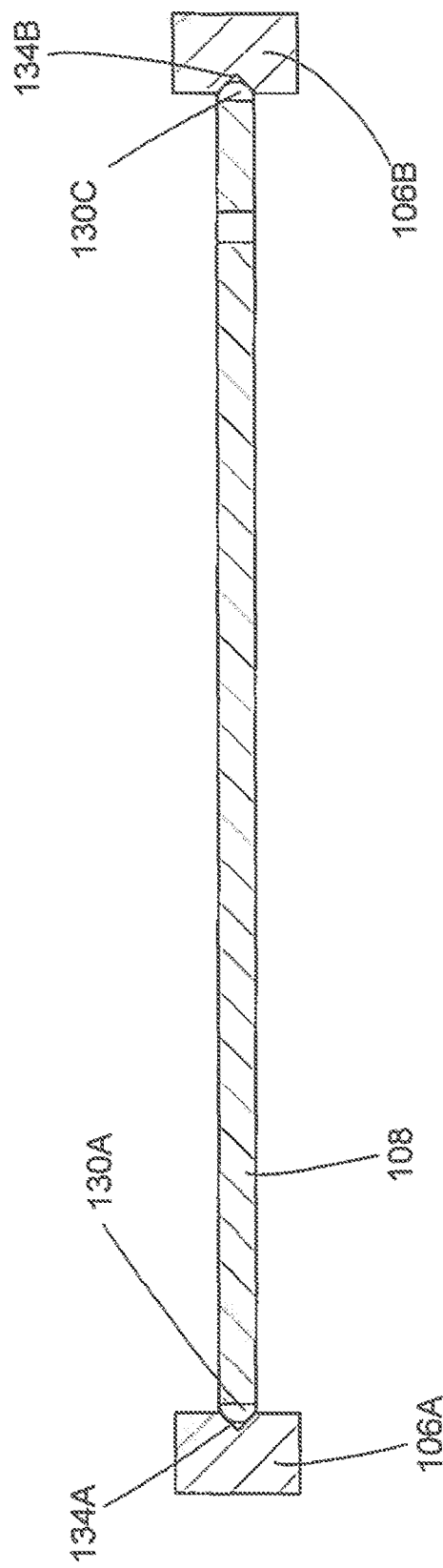
FIG. 1E is a cross-sectional A-A view of the piezoelectric ultrasonic stick-slip stage shown in FIG. 1B.

Referring now more specifically to FIGS. 1A-1E, the carriage assembly 102 is supported by the rails 106A and 106B. In this example, the rails 106A and 106B are located on opposite sides and serve as a guideway for linear movement of the carriage assembly 102 along the z axis, although other rails that provide for other types of motion of the carriage assembly 102 may be contemplated. As shown in FIG. 1E, the rails 106A and 106B include "V" shaped grooves 134A and 134B, respectively, on an inner surface thereof The "V" shaped grooves 134A and 134B allow for interaction with the carriage assembly 102. Referring to both FIG. 3B and FIG. 1E, in this example, the contact pad 130A is configured to mate with the groove 134A on the rail 106A, while the contact pads 130B and 130C are configured to mate with groove 134B on rail 106B. The contact pads 130A-130C and the grooves 134A and 134B form a kinematic guideway that provides precise and stable movement of the carriage assembly 102 that is substantially parallel to the z axis, although the plate 120 and the rails 106A and 106B may include other types and numbers of elements to guide other types of movement of the carriage assembly 102.

Figure 3C:
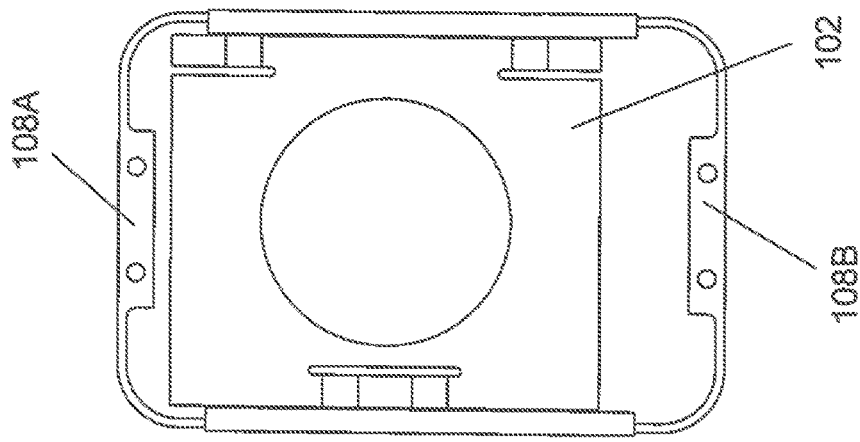
FIG. 3C is a top view of the piezoelectric ultrasonic stick-slip stage shown in FIG. 1E with the carriage assembly at the forward limit (most positive z position).
Figure 3B:
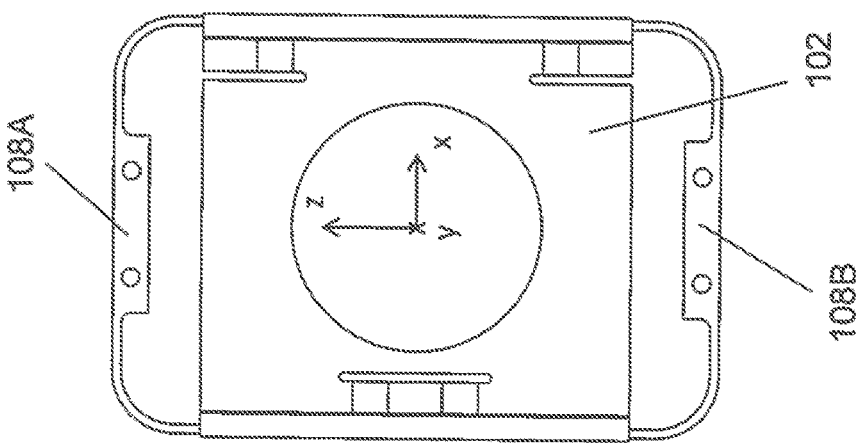
FIG. 3B is a top view of the piezoelectric ultrasonic stick-slip stage shown in FIG. 1E with the carriage assembly at the middle of the travel range (z position is centered).
Figure 3A:
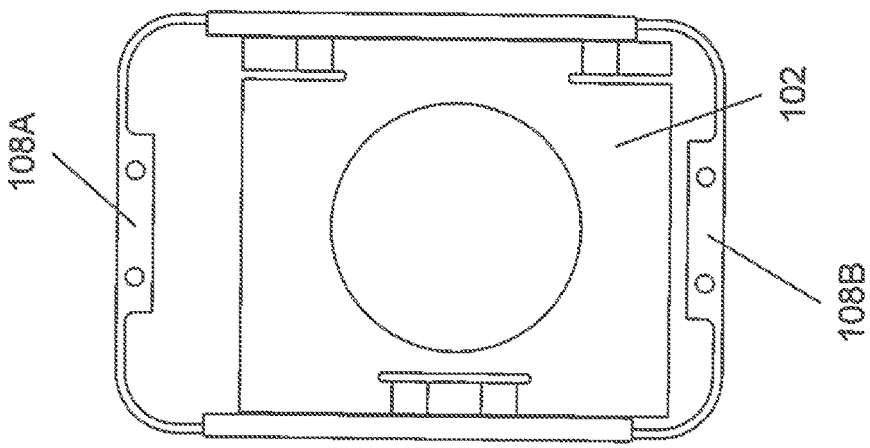
FIG. 3A is a top view of the piezoelectric ultrasonic stick-slip stage shown in FIG. 1E with the carriage assembly at the reverse limit (most negative z position).

The two rails 106A and 106B are supported and connected by the brackets 108A and 108B on opposing ends. The bracket 108A provides compliant linkages 136A and 136B, while the bracket 108B provides compliant linkages 136C and 136D. In this example, the brackets 108A and 108B and their respective compliant linkages 136A, 136B and 136C, 136D provide a preload force in the x direction between rails 106A and 106B and the carriage assembly 102, although other configurations of brackets may be utilized to provide preload forces in other directions. The brackets 108A and 108B provide a fixed structure that connects the rails 106A and 106B with sufficient elasticity and stability to generate consistent friction between the rails 106A and 106B and the contact points 130A, 130B, and 130C on the plate 120. The brackets 108A and 108B also confine the travel range of the carriage assembly 102 along rails 106A and 106B as shown in FIGS. 3A-3C, by way of example. FIG. 3A shows the carriage assembly 102 at the reverse limit (most negative z position), FIG. 3B shows the carriage assembly 102 at the middle of the travel range (z position centered), and FIG. 3C shows the carriage assembly 102 at the forward limit of the travel range (most positive z position).

In this example, the brackets 108A and 108B include mounting holes 138 that may be utilized to mount the piezoelectric stick-slip stage device 100 to fixed surfaces through the use of a screw or other fastening device, although the brackets 108A and 108B may include other types/numbers of features in other locations that allow for mounting of the piezoelectric stick-slip stage device 100 to a fixed surface.

Figure 6:
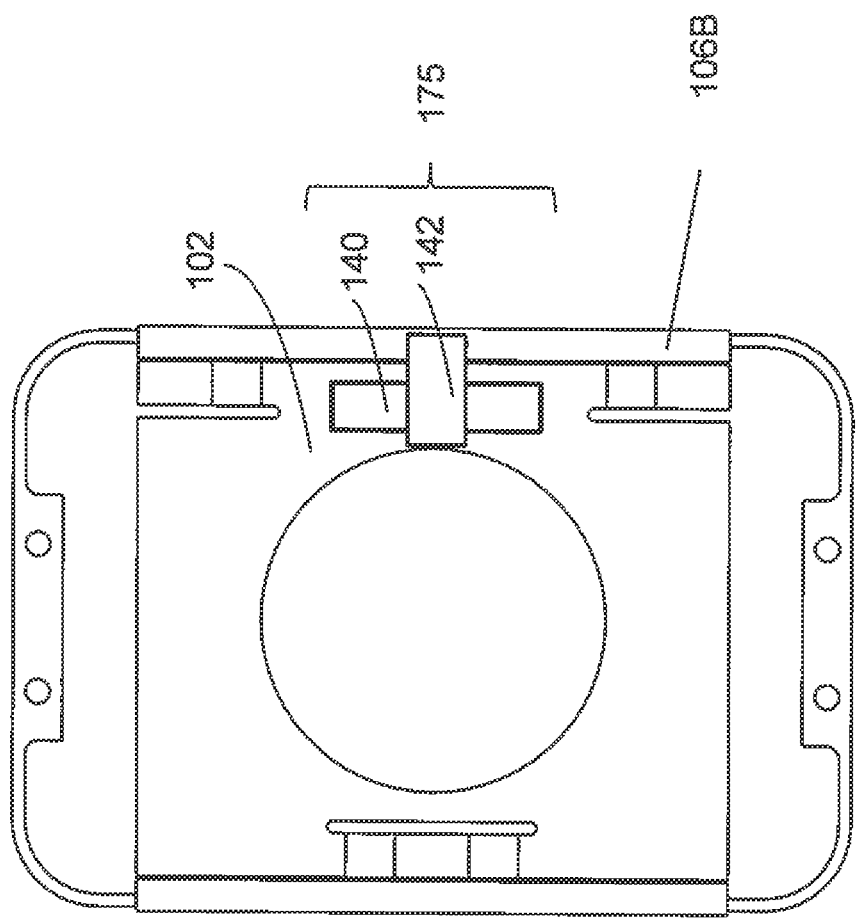
FIG. 6 shows an example of the stick-slip stage system as shown in FIGS. 1A-1E with a position sensor that measures the position of the carriage assembly.

Referring now more specifically to FIG. 6, in one example, the piezoelectric stick-slip stage device 100 further includes the position sensor 110 to monitor the position of the carriage assembly 102 during linear movement. In this example, the position sensor 110 includes a moving sensor element 140 attached to the carriage assembly 102 and a stationary sensor element 142 attached to the rail 106B, although the position sensor 110 may include other types/ numbers of elements in other locations. The position sensor 110 is configured to measure the position of the moving sensor element 140 on the carriage assembly 102. In this example, the moving sensor element 140 is a permanent magnet and the stationary sensor element 142 is a Hall-effect magnetic field sensor, although other position sensor methods may be used to measure the carriage position such as an optical scale, a laser interferometer, or capacitive coupling.

In this example, the moving sensor element 140 and the stationary sensor element 142 work together to measure the relative movement between the carriage assembly 102 and the rail 106B. Movement of the moving sensor element 140, in this example a permanent magnet, changes the measurement on the stationary sensor element 142, in this example, the Hall-effect magnetic field sensor. The changes in the measurement of the stationary sensor element 142 are correlated with the position of the carriage assembly 102.

Figure 2:
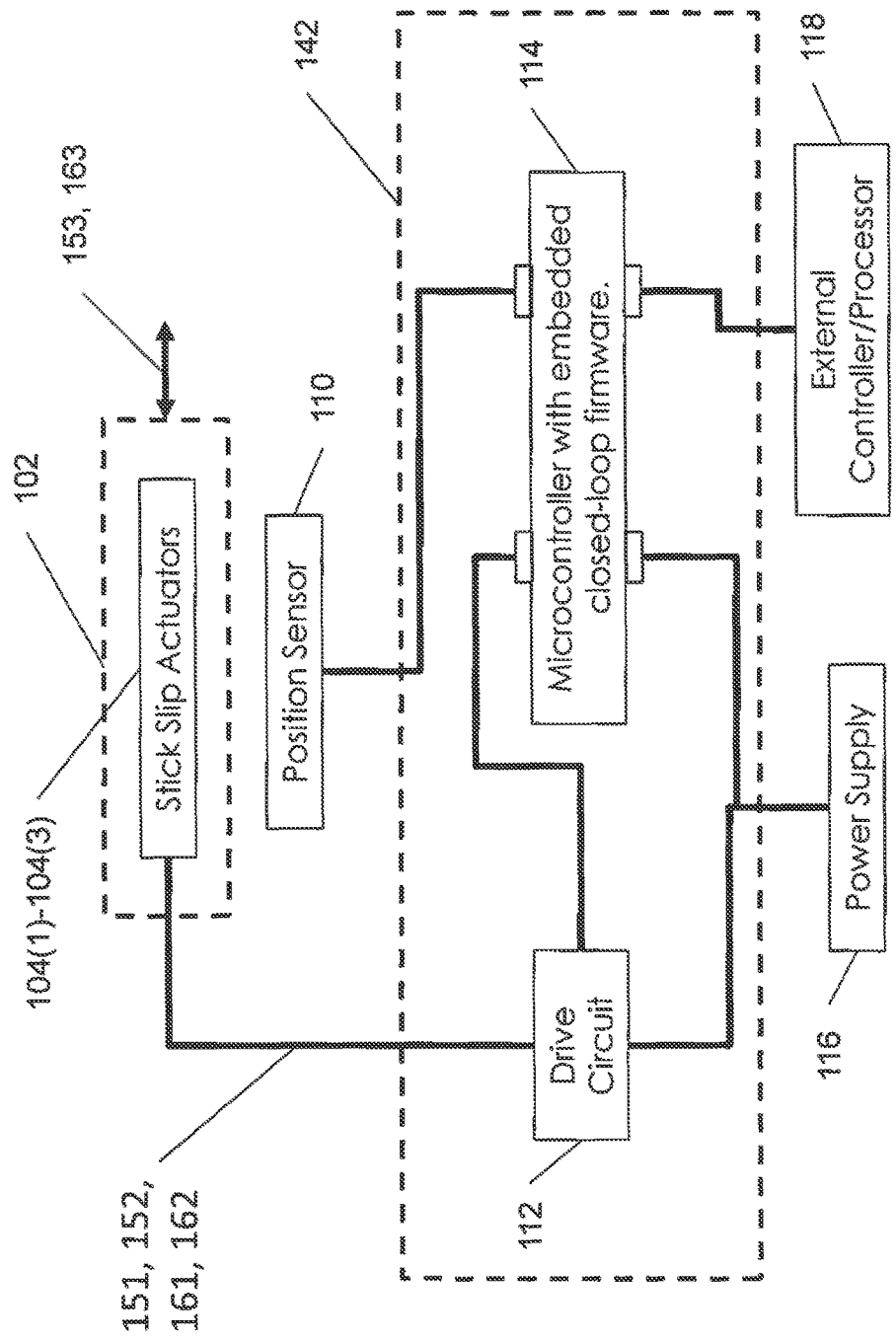
FIG. 2 is a block diagram illustrating an exemplary drive and control system for the piezoelectric ultrasonic stick-slip stage shown in FIGS. 1A-1E.

Referring now more specifically to FIGS. 1A and 2, the active regions 126A1, 126A2, 126B1, and 126B2 of the stick-slip actuators 104(1)-104(3) are electrically connected to the drive circuit 112. Since the active regions 130A1, 130A2, 130B1, and 130B2 move along with the carriage assembly 102 in the z direction, it is desirable to connect the drive circuit 112 to the active region electrodes via a flexible printed circuit board or wires (not shown), which do not significantly add drag force to the carriage assembly 102, although the active areas of the stick-slip actuators 104(1)- 104(3) may be coupled to other types and numbers of devices in other manners. The flexible printed circuits or wires (not shown) receive signals and transmit driving signals from the drive circuit 112 to the stick-slip actuators 104(1)-104(3). A variety of suitable printed circuit boards are disclosed, by way of example only, in U.S. Pat. No. 7,309,943, the disclosure of which is hereby incorporated herein by reference in its entirety, although other types and numbers of flexible printed circuit boards may be utilized.

In this example, the drive circuit 112 generates and provides drive signals, such as drive signals 151, 152, 161 and 162 shown in FIG. 2, to the active regions 126A1, 126A2, 126B1, and 126B2 of the stick-slip actuators 104 (1)-104(3) which move the carriage assembly 102, as described further below. The drive circuit 112 may be, by way of example only, model number NSD2101 produced by AMS® (Unterpremstaetten, Austria), which incorporates the circuits disclosed in U.S. Pat. Nos. 7,786,648, 8,299,733, 8,304,960, 8450,905, and 8,698,374, the disclosures of which are hereby incorporated herein by reference in their entirety, although other types and numbers of drive circuits may be employed.

The position sensor 110 and the drive circuit 112 are electrically connected to the microcontroller 114, although the positions sensor 110 and drive circuit 112 may be electrically coupled to other devices in other locations, such as the external controller/processor 118, by way of example only. In this example, the microcontroller 114 is model number dsPIC33FJ128MC506-I/PT produced by Microchip®, although other suitable microcontrollers may be utilized. The microcontroller 114 includes embedded closed-loop firmware to create a closed-loop drive and control system that is in bi-directional communication with the position sensor 110, the drive circuit 112, and the external controller/processor 118, by way of example. The microcontroller 114 is configured to alter the drive signals provided to the drive circuit 112 based on the measured position of the carriage assembly 102 from the position sensor 110 in a feedback loop, as described in further detail below.

In this example, the drive circuit 112 and the microcontroller 114 are installed on a circuit board 142 for connection to the power supply 116. The circuit board 142 integrates all of the components inside the dashed line shown on FIG. 2 and provides connections for: electrical power to the power supply 116, communication with the external controller 118, receiving position information from the position sensor 110, and sending driving waveforms to the stick-slip actuators 104(1)-104(3).

The microcontroller 114 is further in communication with the position sensor 110 and the external controller/processor 118, although the microcontroller 114 may communicate with other devices in other locations. In this example, the external controller/processor is a computer with a USB, SPI, or I2C communications port that can send serial commands and receive serial information from the microcontroller 192.

Figure 7:
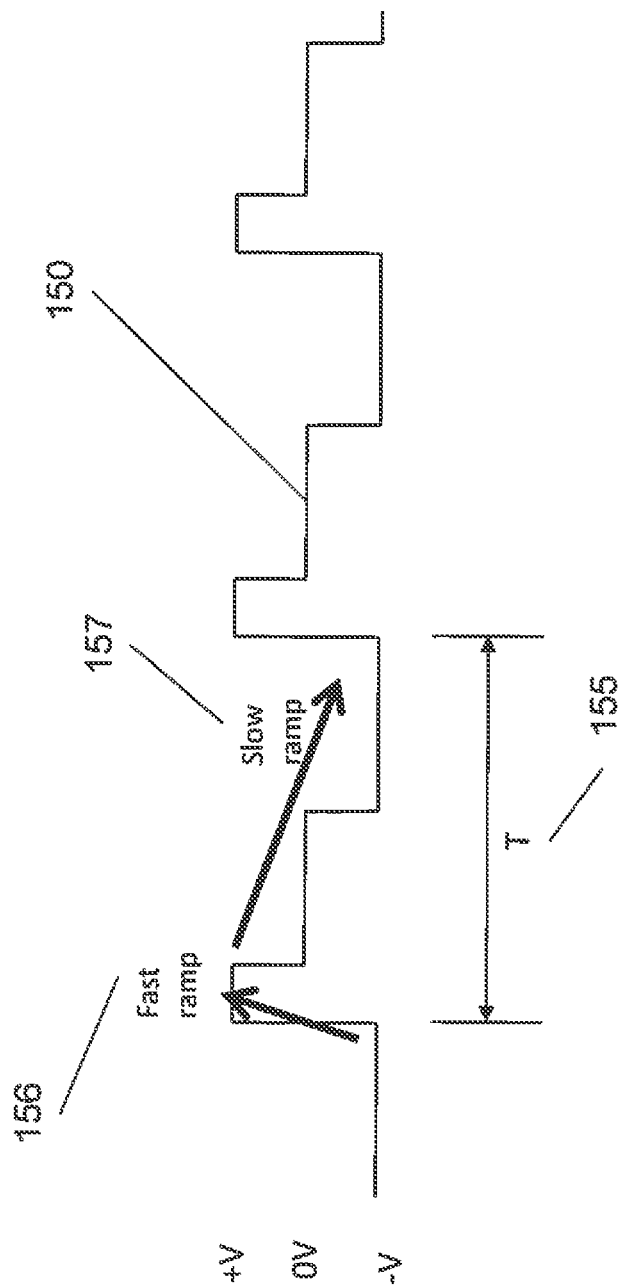
FIG. 7 illustrates the approximate net voltage waveform applied at each of the piezoelectric active regions in the embodiment of the stick-slip stage as shown in FIGS. 1A-1E.

An example of the operation of the piezoelectric stick-slip stage device 100 will now be described with reference to FIGS. 1-9. First, the microcontroller 114 generates an asymmetric voltage waveform 150 as illustrated in FIG. 7. The asymmetric voltage waveform 150 may be stored as part of the embedded firmware on the microcontroller 114, although the asymmetric voltage waveform may be stored in other locations, such as on the external controller/processor 118. The generated asymmetric voltage waveform 150 is then transmitted to the drive circuit 112 for providing drive signals to the active areas of the plate 120.

Referring now more specifically to FIG. 7, the asymmetric waveform 150 is substantially proportional to the electric field applied to the piezoelectric material of plate 120 and is shown as discrete steps that are produced using full-bridge switching electronics, which are an efficient and cost effective electronics solution, although other drive electronic methods and waveforms may be employed. In this example, the asymmetric waveform 150 has a fast ramp 156 and a slow ramp 157 to approximate an asymmetric saw-tooth signal. If the asymmetric waveform 150 is repeated with a period "T" 155, a continuous motion of the carriage assembly 102 is generated. In one example, the frequency of the asymmetric waveform 150 is ultrasonic to minimize the audible noise of the stick-slip stage device 100.

Figure 9A:
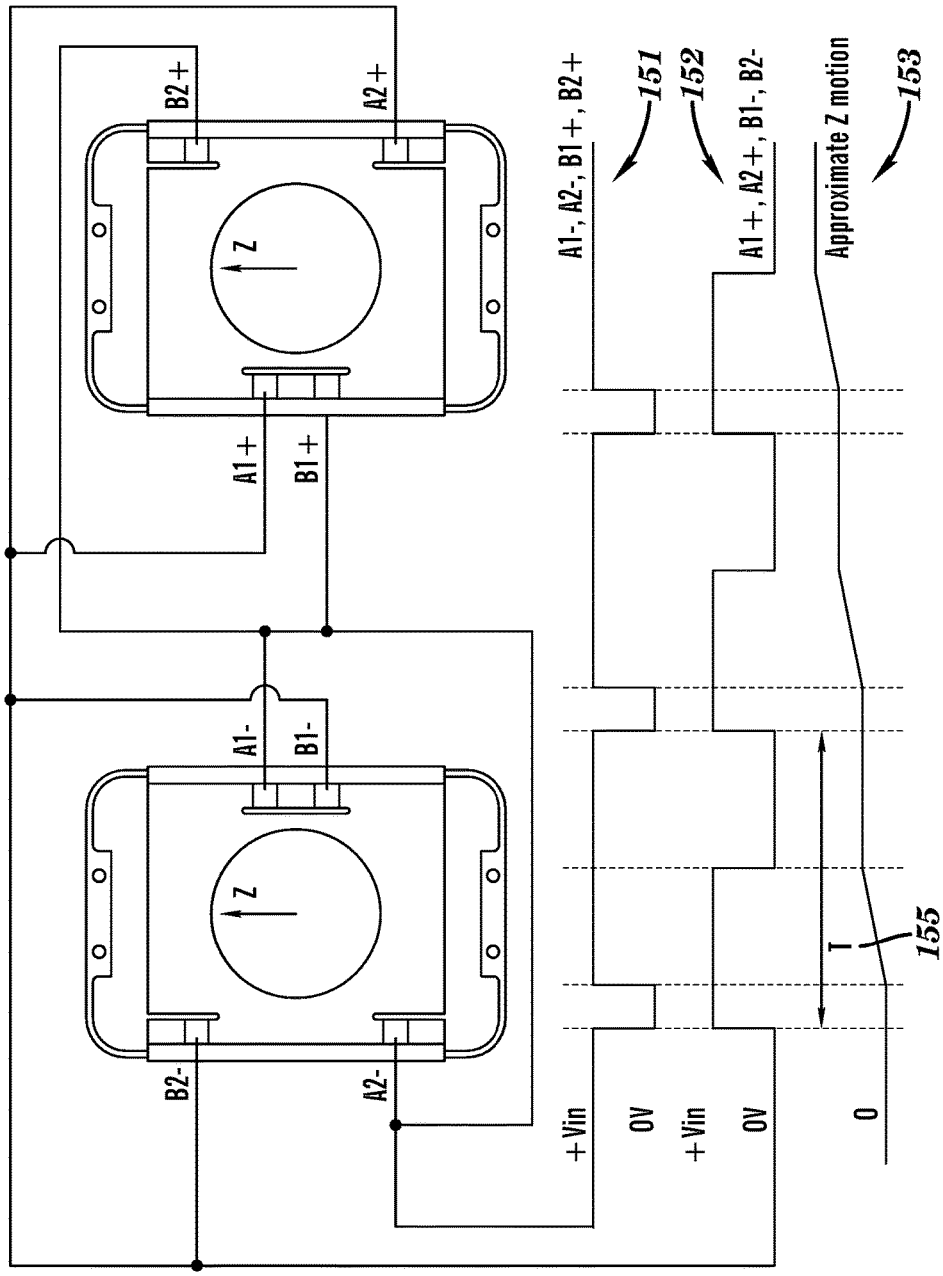
FIG. 9A illustrates the approximate drive signals and their connections to the external electrodes of the piezoelectric active regions in the example of the stick-slip stage as shown in FIGS. 1A-1E in order to achieve positive z motion of the carriage.
Figure 9B:
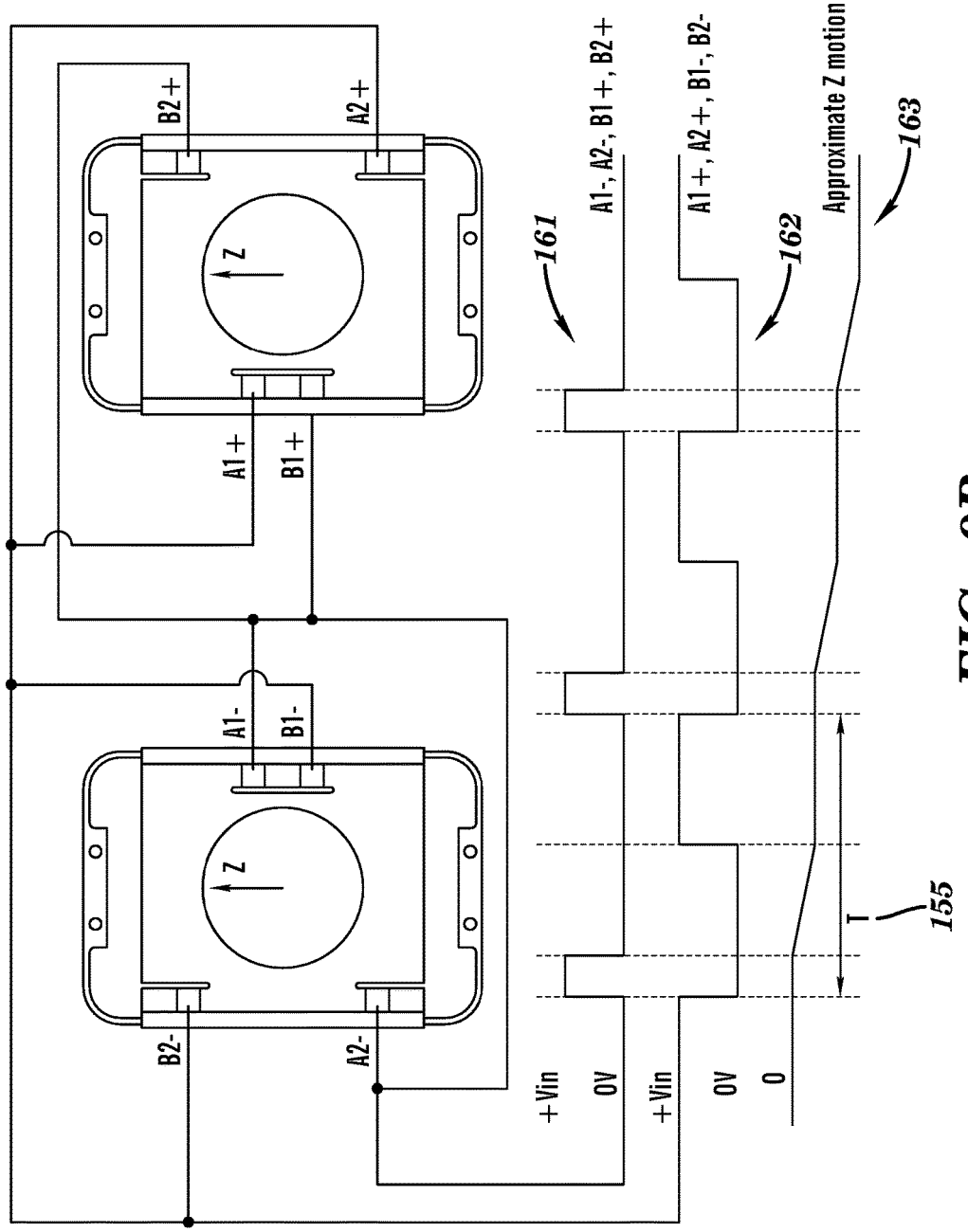
FIG. 9B illustrates the approximate drive signals and their connections external electrodes of the piezoelectric active regions in the example of the stick-slip stage system as shown in FIGS. 1A-1E in order to achieve negative z motion at the main body.

In this example, the drive circuit 112 provides drive signals based on the asymmetric waveform 150, such as drive signals 151, 152, 161, and 162 as shown in FIGS. 2, 9A, and 9B, to the stick-slip actuators 104(1)-104(3) to activate the piezoelectric active areas 126A1, 126A2, 126B1, and 126B2. Activation of the piezoelectric active areas 126A1, 126A2, 126B1, and 126B2 generates the stick-slip movement between the rails 106A and 106B and contact pads 130A, 130B, and 130C as described below.

Figure 8:
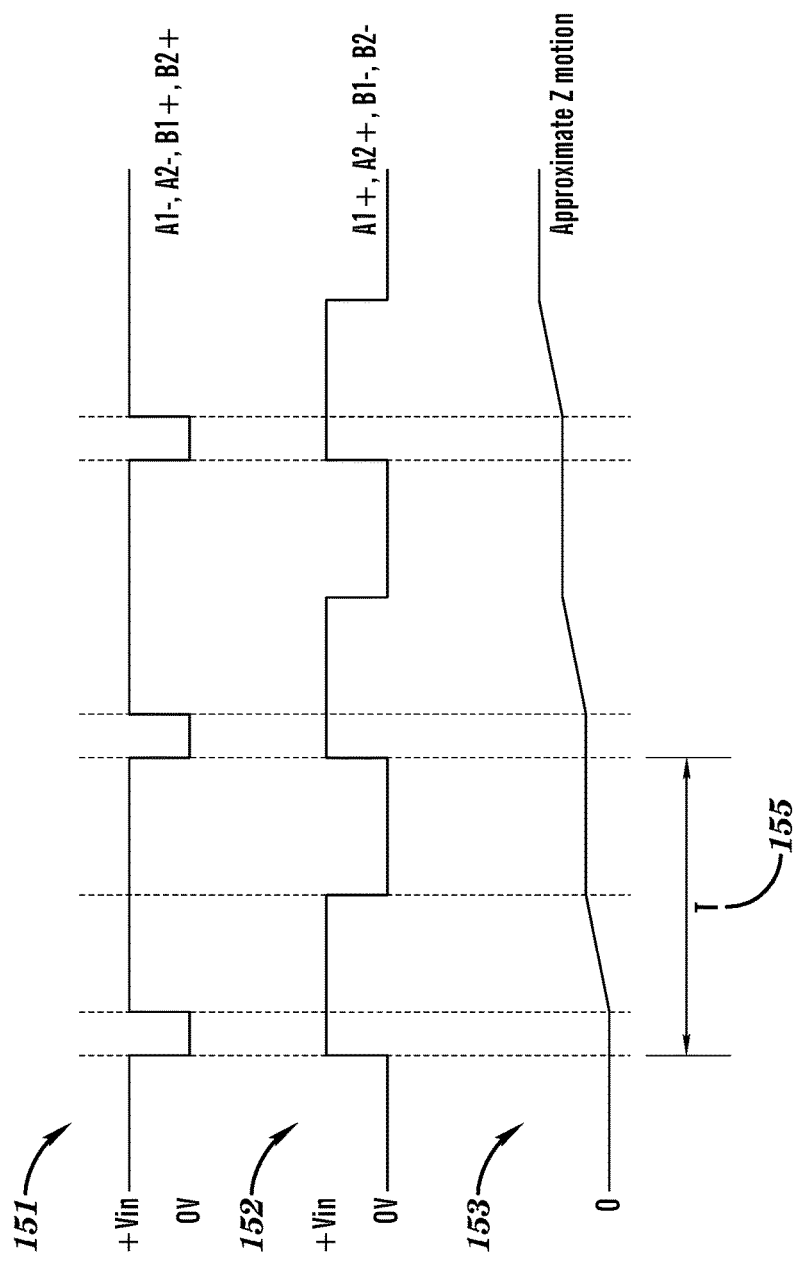
FIG. 8 illustrates the approximate drive signals applied at the external electrodes of the piezoelectric active regions in the example of the stick-slip stage as shown in FIGS. 1A-1E (The sum of these voltages produce the approximate waveform shown in FIG. 7.) and the corresponding positive z motion at the main body.

In one example, the asymmetric voltage waveform 150 is applied from the drive circuit 112 to the piezoelectric active regions 126A1, 126A2, 126B1, and 130B2 as illustrated in FIGS. 8, and 9A in the form of drive signals 151 and 152. When the drive signal 151 is applied to electrodes A1−, A2−, B1+, and B2+, and the drive signal 152 is applied to electrodes A1+, A2+, B1−, and B2−, the differential signal across the active regions is approximately the asymmetric waveform 150 as shown in FIG. 7.

During the fast ramp 156 in FIG. 7, due to piezoelectric d31 strain, the active regions 126A1 and 126A2 shrink relatively fast along the z direction while active regions 126B1 and 126B2 expand relatively fast along the z direction. Because the carriage assembly 102 has much more mass than the mass of the stick-slip actuators 104(1)-104(3), the carriage assembly 102 stays relatively fixed while the contact pads 130A, 130B, and 130C overcome the contact friction and slip with respect to the rails 106A and 106B. Accordingly, the contact pads 130A, 130B, and 130C move in the +z direction a small step relative to rails 106A and 106B.

During the slow ramp 157 shown in FIG. 7, due to piezoelectric d31 strain, active regions 126A1 and 126A2 expand relatively slower along the z direction while active regions 126B1 and 126B2 shrink relatively slowly along the z direction. The friction force between contact pads 130A, 130B, and 130C and the rails 106A and 106B is not overcome and the carriage assembly 102 moves in the +z direction a small step relative to the rails 106A and 106B. This process repeats, and a net +z motion 153 is achieved at the carriage assembly 102 as shown in FIGS. 8 and 9A.

Movement in the reverse direction (−z motion) of the carriage assembly requires drive signals 161 and 162 based on an inverted version of asymmetrical waveform 150 as shown in FIG. 9B, where the voltage waveforms are inverted and applied as drive signals 161 and 162 by the drive circuit 112 to the piezoelectric active regions 126A1, 126A2, 126B1, and 126B2. When the drive signal 161 is applied to electrodes A1−, A2−, B1+, and B2+, and the drive signal 162 is applied to electrodes A1+, A2+, B1−, and B2−, the differential signal across the active regions represents the inverted version of the voltage asymmetrical waveform 150 shown in FIG. 7.

During the fast ramp, due to piezoelectric d31 strain, the active regions 126A1 and 126A2 expand relatively fast along the z direction while active regions 126B1 and 126B2 shrink relatively fast along the z direction. Because the carriage assembly 102 has much more mass than the mass of the stick-slip actuators 104(1)-104(3), the carriage assembly 102 stays relatively fixed while the contact pads 130A, 130B, and 130C overcome the contact friction and slip with respect to the rails 106A and 106B. As a result, the contact pads 130A, 130B, and 130C move in the −z direction a small step relative to rails 106A and 106B.

During the slow ramp, due to piezoelectric d31 strain, active regions 126A1 and 126A2 shrink relatively slower along the z direction, and active regions 126B1 and 126B2 expand relatively slowly along the z direction. The friction force between the contact pads 130A, 130B, and 130C and the rails 106A and 106B is not overcome and the carriage assembly 102 moves in the −Z direction a small step relative to rails 106A and 106B. This process repeats, and a net −z motion 163 is achieved at the main body 109 as shown in FIG. 7B.

The microcontroller 114 includes embedded closed-loop firmware to create a closed-loop drive and control system that is in bi-directional communication with the position sensor 110, the drive circuit 112, and the external controller/processor 118, by way of example, during operation of the piezoelectric stick-slip stage device 100.

During motion of the carriage assembly 102 as described above, the position sensor 110 monitors the linear movement of the carriage assembly 102 with respect to rails 106A and 106B. In this example, the moving sensor element 140 and the stationary sensor element 142 work together to measure the relative movement between the carriage assembly 102 and the rail 106B. The moving sensor element 140 is coupled to the plate 120 of the carriage assembly 102 such that it moves along with the carriage assembly in the z direction. Movement of the moving sensor element 140, in this example a permanent magnet, as a result of the movement of the carriage assembly 102 changes the measurement on the stationary sensor element 142, in this example, the Hall-effect magnetic field sensor. The changes in the measurement of the stationary sensor element 142 are transmitted to the microcontroller 114, by way of example, and are correlated with the position of the carriage assembly 102 along the rails 106A and 106B. The microcontroller 114 is further configured to alter the drive signals provided to the drive circuit 112 based on the measured position of the carriage assembly 102 from the position sensor 110 in a feedback loop, such that the microcontroller 114 controls the linear movement of the carriage assembly 102 in the z direction along the rails 106A and 106B.

Accordingly, this technology, as illustrated and described with the example herein, provides a number of advantages including providing a very thin linear stage, since the piezoelectric active regions, main body, and reaction masses are all part of one plate. This also eases the manufacturing process of this stage. Additionally, this technology advantageously holds the position of the main body or carriage without an additional power input. The stage can also potentially be operated directly from battery voltage.

Having thus described the basic concept of the invention, it will be apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. A stick-slip stage device comprising:
    a carriage assembly configured to support a payload, the carriage assembly comprising at least three piezoelectric stick-slip actuators each having one or more contact points;
    at least two rails positioned on opposing sides of the carriage assembly and configured to interact with one or more of the contact points to form a guideway for movement of the carriage assembly;
    a fixed structure connecting the at least two rails and configured to generate a friction force between the at least two rails and one or more of the contact points of the at least three piezoelectric stick-slip actuators.

2. The stick-slip stage device as set forth in claim 1 further comprising:
    a wave generation apparatus operably coupled to the at least three piezoelectric stick-slip actuators.

3. The stick-slip stage device as set forth in claim 2, wherein the wave generation apparatus comprises:
    a microcontroller configured to be capable of generating an asymmetric oscillating waveform; and
    a drive circuit coupled to the microcontroller and the at least three stick-slip actuators and configured to be capable of applying the generated asymmetric oscillating waveform to the at least three stick-slip actuators to generate relative movement between the carriage assembly and the at least two rails.

4. The stick-slip stage device as set forth in claim 3, wherein the drive circuit comprises a full-bridge switching circuit.

5. The stick-slip stage device as set forth in claim 3, wherein the microcontroller is further configured to be capable of generating the asymmetric oscillating waveform having an ultrasonic frequency.

6. The stick-slip stage device as set forth in claim 3 further comprising:
    a position sensor located at least partially on the carriage assembly and configured to determine a location of the carriage assembly along the at least two rails, wherein the position sensor is operably coupled to the drive circuit and the microcontroller to form a closed-loop feedback system for controlling movement of the carriage assembly.

7. The stick-slip stage device as set forth in claim 1, wherein the carriage assembly is formed from a single plate having the at least three stick-slip actuators located on the plate.

8. The stick-slip stage device as set forth in claim 7, wherein the single plate comprises a piezoelectric ceramic or an electrostrictive ceramic.

9. The stick-slip stage device as set forth in claim 1, wherein each of the at least three stick-slip actuators comprises an active area that moves by D31 strain and a reaction mass.

10. The stick-slip stage device as set forth in claim 9, wherein the at least three stick-slip actuators have a summed mass less than ten percent of a mass of the carriage assembly.

11. The stick-slip stage device as set forth in claim 1, wherein the at least two rails are parallel with respect to one another to provide a linear guideway from the carriage assembly.

12. A method of making a stick-slip stage device comprising:
    providing a carriage assembly configured to support a payload, the carriage assembly comprising at least three piezoelectric stick-slip actuators each having one or more contact points;
    positioning at least two rails on opposing sides of the carriage assembly, the at least two rails configured to interact with one or more of the contact points to form a guideway for movement the carriage assembly;
    providing a fixed structure connecting the at least two rails and configured to generate a friction force between the at least two rails and one or more of the contact points of the at least three piezoelectric stick-slip.

13. The method as set forth in claim 12 further comprising:
    operably coupling a wave generation apparatus to the at least three piezoelectric stick-slip actuators.

14. The method as set forth in claim 13 further comprising:
    providing a microcontroller configured to be capable of generating an asymmetric oscillating waveform; and
    coupling a drive circuit to the microcontroller and the at least three stick-slip actuators, the drive circuit being configured to be capable of applying the generated asymmetric oscillating waveform to the at least three stick-slip actuators to generate relative movement between the carriage assembly and the at least two rails.

15. The method as set forth in claim 14, wherein the coupling the drive circuit further comprises coupling a full-bridge switching circuit.

16. The method as set forth in claim 14, wherein the providing the microcontroller further comprises providing the microcontroller that is further configured to be capable of generating the asymmetric oscillating waveform having an ultrasonic frequency.

17. The method as set forth in claim 14 further comprising:
    operably coupling providing a position sensor located at least partially on the carriage assembly to the drive circuit and the microcontroller, wherein the position sensor is configured to determine a location of the carriage assembly along the at least two rails to form a closed-loop feedback system for controlling movement of the carriage assembly.

18. The method as set forth in claim 12, wherein the carriage assembly is formed from a single plate having the at least three stick-slip actuators located on the plate.

19. The method as set forth in claim 18, wherein the single plate comprises a piezoelectric ceramic or an electrostrictive ceramic.

20. The method as set forth in claim 12, wherein each of the at least three stick-slip actuators comprises an active area that moves by D31 strain and a reaction mass.

21. The method as set forth in claim 20, wherein the at least three stick-slip actuators have a summed mass less than ten percent of a mass of the carriage assembly.

22. The method as set forth in claim 12, wherein the at least two rails are parallel with respect to one another to provide a linear guideway from the carriage assembly.

* * * * *